(12) United States Patent
Lv et al.

(10) Patent No.: US 10,943,926 B2
(45) Date of Patent: Mar. 9, 2021

(54) THIN-FILM TRANSISTOR, ARRAY SUBSTRATE, DISPLAY PANEL AND DISPLAY DEVICE AND FABRICATION METHOD THEREOF

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Zhenhua Lv, Beijing (CN); Shijun Wang, Beijing (CN); Xi Chen, Beijing (CN); Yang You, Beijing (CN); Lei Wang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/556,941

(22) PCT Filed: Feb. 9, 2017

(86) PCT No.: PCT/CN2017/073157
§ 371 (c)(1),
(2) Date: Sep. 8, 2017

(87) PCT Pub. No.: WO2017/193657
PCT Pub. Date: Nov. 16, 2017

(65) Prior Publication Data
US 2018/0190676 A1   Jul. 5, 2018

(30) Foreign Application Priority Data

May 13, 2016 (CN) .......................... 201610318303.7

(51) Int. Cl.
H01L 27/12     (2006.01)
H01L 29/786   (2006.01)
H01L 29/66     (2006.01)

(52) U.S. Cl.
CPC .... *H01L 27/1222* (2013.01); *H01L 29/66765* (2013.01); *H01L 29/78606* (2013.01); *H01L 29/78669* (2013.01); *H01L 29/78696* (2013.01)

(58) Field of Classification Search
None
See application file for complete search history.

(56) References Cited

U.S. PATENT DOCUMENTS

| 2005/0250230 | A1 | 11/2005 | Chen |
| 2010/0051948 | A1 | 3/2010 | Kawata |
| 2015/0155391 | A1 | 6/2015 | Lee et al. |

FOREIGN PATENT DOCUMENTS

| CN | 1452250 A | 10/2003 |
| CN | 1708856 A | 12/2005 |

(Continued)

OTHER PUBLICATIONS

China First Office Action, Application No. 201610318303.7, dated May 3, 2018, 24 pps.: with English translation.

(Continued)

*Primary Examiner* — Alexander G Ghyka
(74) *Attorney, Agent, or Firm* — Armstrong Teasdale LLP

(57) ABSTRACT

The present disclosure relates to a thin-film transistor, an array substrate, a display panel and a display device and fabrication methods thereof. The thin-film transistor includes a gate insulation layer, an active layer having a source region, a drain region, and a channel region, a first doping layer on the source region, a second doping layer on the drain region, and at least one third doping layer arranged between the first doping layer and the second doping layer, (Continued)

wherein the first, the second, and the third doping layers have same conductivity type, and wherein the third doping layer is positioned in the channel region and contacts the gate insulation layer, and the third doping layer does not contact the first doping layer and the second doping layer simultaneously, or the third doping layer is positioned on the channel region and only contacts the first or the second doping layer.

20 Claims, 7 Drawing Sheets

(56) References Cited

FOREIGN PATENT DOCUMENTS

| | | |
|---|---|---|
| CN | 103733346 A | 4/2014 |
| CN | 104183603 A | 12/2014 |
| CN | 104465405 A | 3/2015 |
| CN | 105355588 A | 2/2016 |
| CN | 105789326 A | 7/2016 |
| KR | 20160013473 A | 2/2016 |

OTHER PUBLICATIONS

China Second Office Action, Application No. 201610318303.7, dated Jan. 28, 2019, 19 pps.: with English translation.
English translation of PCT International Search Report, Application No. PCT/CN2017/073157, dated Apr. 26, 2017, 3 pages.
PCT Written Opinion, Application No. PCT/CN2017/073157, dated Apr. 26, 2017, 7 pages.: with English translation of relevant part.

THIN-FILM TRANSISTOR, ARRAY SUBSTRATE, DISPLAY PANEL AND DISPLAY DEVICE AND FABRICATION METHOD THEREOF

CROSS REFERENCE TO RELATED APPLICATIONS

This patent application is a National Stage Entry of PCT/CN2017/073157 filed on Feb. 9, 2017, which claims the benefit and priority of Chinese Patent Application No. 201610318303.7 filed on May 13, 2016, the disclosures of which are incorporated herein by reference in their entirety as part of the present application.

BACKGROUND

The present disclosure relates to the field of display technologies, and more particularly to a thin-film transistor and a fabrication method thereof, an array substrate and a fabrication method thereof, a display panel and a fabrication method thereof, and a display device and a fabrication method thereof.

For a thin-film transistor (TFT), the larger the width-to-length ratio (W/L) of a channel is, the greater the on-state current Ion is. However, limited by precision of at least some prior art array process exposure devices, it is difficult to further shorten the channel length L of the thin-film transistor. The higher the pixels per inch (PPI) of high-end products are, the less the pixel charging time is. To meet charging rate demands of the products, the width of the thin-film transistor has to be continuously increased, which seriously affects a pixel aperture ratio (AR) and causes power consumption of a liquid crystal display to significantly rise.

BRIEF DESCRIPTION

Embodiments of the present disclosure provide a thin-film transistor and a fabrication method thereof, an array substrate and a fabrication method thereof, a display panel and a fabrication method thereof, and a display device and a fabrication method thereof, which can solve the problem that in the prior art it is difficult to further shorten the channel length.

The present disclosure provides a thin-film transistor.

A first aspect of the present disclosure provides a thin-film transistor, which includes a gate insulation layer, an active layer, having a source region, a drain region and a channel region positioned between the source region and the drain region, a first doping layer on the source region, and a second doping layer on the drain region. The thin-film transistor further includes at least one third doping layer arranged between the first doping layer and the second doping layer. The first doping layer, the second doping layer, and the third doping layer have a same conductivity type. The third doping layer is positioned in the channel region and contacts the gate insulation layer, and the third doping layer does not contact the first doping layer and the second doping layer simultaneously. Or, the third doping layer is positioned on the channel region and only contacts one of the first doping layer or the second doping layer.

In one embodiment, the thin-film transistor further includes a source electrode arranged on the first doping layer, and a drain electrode arranged on the second doping layer. The gate insulation layer is positioned on a side, opposite to a side where the first doping layer and the second doping layer are formed, of the active layer, and is positioned between the active layer and a substrate.

In one embodiment, the thin-film transistor further includes a source electrode arranged on the first doping layer, and a drain electrode arranged on the second doping layer. The gate insulation layer is positioned on a side where the first doping layer and the second doping layer are formed, of the active layer, and the active layer is positioned between the gate insulation layer and a substrate.

In one embodiment, the active layer includes amorphous silicon.

In one embodiment, the conductivity type of the first doping layer, the second doping layer, and the third doping layer is an N type.

The present disclosure also provides an array substrate.

A second aspect of the present disclosure provides an array substrate, which includes the above thin-film transistor.

The present disclosure also provides a display panel.

A third aspect of the present disclosure provides a display panel, which includes the above array substrate.

The present disclosure also provides a display device.

A fourth aspect of the present disclosure provides a display device, which includes the above display panel.

The present disclosure also provides a method for fabricating a thin-film transistor.

A fifth aspect of the present disclosure provides a method for fabricating a thin-film transistor, including forming an active layer, the active layer having a source region, a drain region, and a channel region positioned between the source region and the drain region, and forming a first doping layer on the source region and a second doping layer on the drain region. The method further includes forming at least one third doping layer between the first doping layer and the second doping layer, wherein the first doping layer, the second doping layer and the third doping layer have a same conductivity type. The third doping layer is positioned in the channel region and contacts the gate insulation layer, and the third doping layer does not contact the first doping layer and the second doping layer simultaneously. Or, the third doping layer is positioned on the channel region and only contacts the first doping layer or the second doping layer.

In one embodiment, the method for fabricating a thin-film transistor further includes forming a gate electrode on a substrate, and forming the gate insulation layer on the gate electrode. Forming an active layer includes forming the active layer on the gate insulation layer after the gate insulation layer is formed. Forming the third doping layer includes forming, by using an ion implantation method in the channel region, the third doping layer positioned in the channel region and in contact with the gate insulation layer.

In one embodiment, the method for fabricating a thin-film transistor further includes forming a gate electrode on a substrate, forming the gate insulation layer on the gate electrode, and forming a source electrode on the first doping layer and a drain electrode on the second doping layer. Forming an active layer includes forming the active layer on the gate insulation layer after the gate insulation layer is formed. Forming the third doping layer includes forming a capping layer on an exposed surface of the channel region after the source electrode and the drain electrode are formed, and patterning the capping layer to form the third doping layer positioned on the channel region and only contacts one of the first doping layer or the second doping layer.

In one embodiment, the method for fabricating a thin-film transistor further includes forming the gate insulation layer on the channel region after the active layer is formed on a substrate and the first doping layer and the second doping layer are formed. Forming the third doping layer includes forming, by using an ion implantation method in the channel region, the third doping layer in contact with the gate insulation layer.

In one embodiment, the method for fabricating a thin-film transistor further includes forming a source electrode on the first doping layer and forming a drain electrode on the second doping layer, and forming the gate insulation layer on the channel region after the active layer is formed on a substrate and the first doping layer and the second doping layer are formed. Forming the third doping layer includes forming a capping layer on an exposed surface of the channel after the source electrode and the drain electrode are formed and before the gate insulation layer is formed, and patterning the capping layer to form the third doping layer positioned on the channel region and only contacts the first doping layer or the second doping layer.

In one embodiment, the active layer includes amorphous silicon.

In one embodiment, the conductivity type of the first doping layer, the second doping layer and the third doping layer is an N type.

The present disclosure also provides a method for fabricating an array substrate.

A sixth aspect of the present disclosure provides a method for fabricating an array substrate, which includes the above method for fabricating a thin-film transistor.

The present disclosure also provides a method for fabricating a display panel.

A seventh aspect of the present disclosure provides a method for fabricating a display panel, which includes the method for fabricating an array substrate.

The present disclosure also provides a method for fabricating a display device.

An eighth aspect of the present disclosure provides a method for fabricating a display device, which includes the above method for fabricating a display panel.

BRIEF DESCRIPTION OF THE DRAWINGS

To describe technical solutions of the embodiments of the present disclosure more clearly, the following will briefly introduce the accompanying drawings of the embodiments. It should be known that the accompanying drawings in the following description merely involve with some embodiments of the present disclosure, but not limit the present disclosure, in which.

DETAILED DESCRIPTION

Figure 1A:
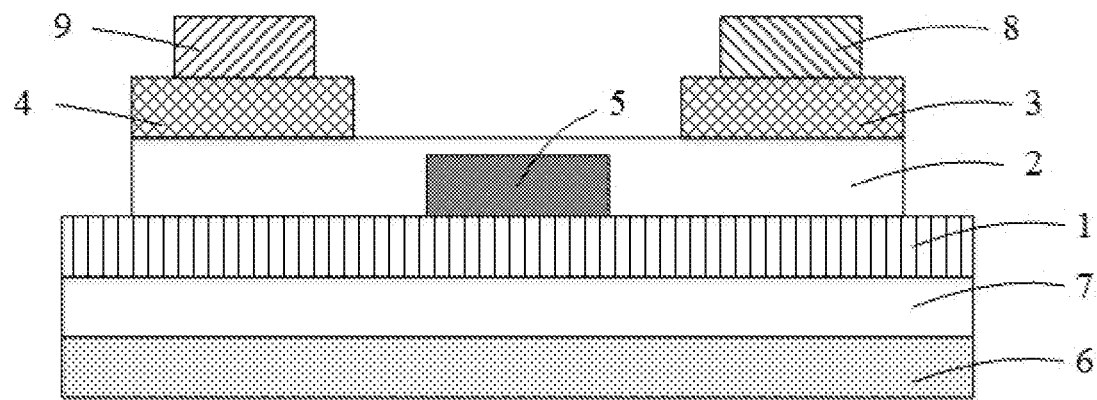
FIG. 1A is a schematic diagram of a transistor according to an embodiment of the present disclosure.

To make technical solutions and advantages of the embodiments of the present disclosure clearer, the following will clearly and completely describe the technical solutions of the embodiments of the present disclosure with reference to the accompanying drawings. Apparently, the described embodiments are some but not all of the embodiments of the present disclosure. All other embodiments obtained by a person skilled in the art based on the described embodiments of the present disclosure without creative efforts shall fall within the protection scope of the present disclosure.

When an element and an embodiment of the present disclosure are introduced, the articles "a", "an", "the" and "said" are intended to indicate that one or more elements are present. The terms "comprising", "including", "containing" and "having" are intended to be inclusive and mean that there may be additional elements other than the listed elements.

For the purpose of surface description hereinafter, as direction-calibrated in the accompanying drawings, the terms "above", "below", "left", "right", "vertical", "horizontal", "top", "bottom" and derivatives thereof shall relate to the present disclosure. The terms "covered with", "on top of", "positioned on", or "positioned on top of" mean that, for example, a first element of a first structure is on a second element of a second structure, wherein an intermediate element such as an interface structure may exist between the first element and the second element. The term "contact" means that, for example, the first element of the first structure and the second element of the second structure are connected, and other elements may exist or not exist on the interfaces of the two elements.

FIGS. 1A-2B are schematic diagrams of a transistor according to different embodiments of the present disclosure. As shown in FIGS. 1A-2B, the thin-film transistor according to the embodiments of the present disclosure includes a gate insulation layer 1, an active layer 2, having a source region, a drain region, and a channel region positioned between the source region and the drain region, a first doping layer 3 on the source region, and a second doping layer 4 on the drain region. The thin-film transistor further includes at least one third doping layer 5 arranged between the first doping layer 3 and the second doping layer 4. The first doping layer 3, the second doping layer 4, and the third doping layer 5 have a same conductivity type. The third doping layer 5 is positioned in the channel region and in contact with the gate insulation layer 1, and the third doping layer 5 does not contact the first doping layer 3 and the second doping layer 4 (referring to FIG. 1A and FIG. 2A) simultaneously. Alternatively, the third doping layer 5 is positioned on the channel region and only contacts the first doping layer 3 or the second doping layer 4 (referring to FIG. 1B and FIG. 2B).

Therefore, a channel length is reduced, a negative effect on a pixel aperture ratio is avoided, and power consumption rise is prevented Those skilled in the art may understand that the source region of the active layer herein refers to a region of the active layer corresponding to the source electrode, the drain region of the active layer refers to a region of the active layer corresponding to the drain electrode, and the channel region of the active layer refers to a region of the active layer between the source region and the drain region.

In one embodiment, the gate insulation layer is positioned on a side, opposite to a side where the first doping layer and the second doping layer are formed, of the active layer, and is positioned between the active layer and a substrate. That is, in such a case, a structure of the thin-film transistor is a bottom gate structure.

For a bottom gate structure, specifically, FIG. 1A schematically illustrates a case where the third doping layer 5 is positioned in the channel region. As shown in FIG. 1A, on a substrate 6 there is provided with a gate electrode 7, on the gate electrode 7 there is provided with the gate insulation layer 1, on the gate insulation layer 1 there is provided with the active layer 2, on the active layer 2 there is provided with the first doping layer 3 and the second doping layer 4, on the first doping layer 3 there is provided with a source electrode 8, on the second doping layer 4 there is provided with a drain electrode 9, and between the first doping layer 3 and the second doping layer 4 there is provided with the third doping layer 5. Herein, positions of the source and the drain may be interchangeable. For the case as shown in FIG. 1A, it is to be pointed out that a thickness of the third doping layer 5 is not particularly limited. The third doping layer 5 contacts the gate insulation layer 1. That is, a side of the third doping layer 5 reaches a surface of the active layer. It is to be noted that an opposite side of the third doping layer 5 does not necessarily need to reach an opposite surface of the active layer 2. Although FIG. 1A illustrates a case where the opposite side of the third doping layer 5 does not reach an opposite surface of the active layer 2, the embodiments of the present disclosure further include a case where the opposite side of the third doping layer 5 reaches the opposite surface of the active layer 2. Of course, the embodiments of the present disclosure may further include a case where the opposite side of the third doping layer 5 goes beyond the opposite surface of the active layer 2.

It is also to be pointed out that the third doping layer 5 in FIG. 1A neither contacts the first doping layer 3 nor contacts the second doping layer 4. Nevertheless, the third doping layer 5 may contacts the first doping layer 3 or the second doping layer 4 as required, as long as the third doping layer 5 does not contact the first doping layer 3 and the second doping layer 4 simultaneously.

Figure 1B:
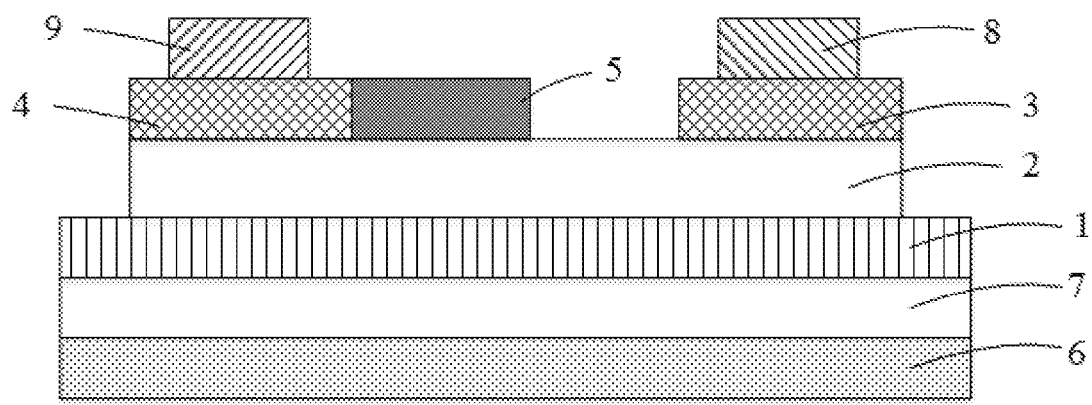
FIG. 1B is a schematic diagram of a transistor according to an embodiment of the present disclosure.

For the bottom gate structure, specifically, FIG. 1B schematically illustrates a case where the third doping layer 5 is positioned on the channel region. As shown in FIG. 1B, on the substrate 6 there is provided with the gate electrode 7, on the gate electrode 7 there is provided with the gate insulation layer 1, on the gate insulation layer 1 there is provided with the active layer 2, on the active layer 2 there is provided with the first doping layer 3 and the second doping layer 4, on the first doping layer 3 there is provided with the source electrode 8, on the second doping layer 4 there is provided with the drain electrode 9, and between the first doping layer 3 and the second doping layer 4 there is provided with the third doping layer 5. Herein, positions of the source and the drain may be interchangeable. In FIG. 1B, an example is taken in which the third doping layer contacts the second doping layer 4. As shown in FIG. 1B, the third doping layer 5 is positioned on the channel, and a side of the third doping layer 5 contacts the active layer 2. It is to be pointed out that the thickness of the third doping layer 5 is not particularly limited. Although in FIG. 1B the thickness of the third doping layer 5 is equal to that of the second doping layer 4, the thickness of the third doping layer 5 also may be not equal to that of the second doping layer 4.

In another embodiment, the gate insulation layer is positioned on a side of the active layer where the first doping layer and the second doping layer are formed, and the active layer is positioned between the gate insulation layer and the substrate. That is, in such a case, the structure of the thin-film transistor is a top gate structure.

Figure 2A:
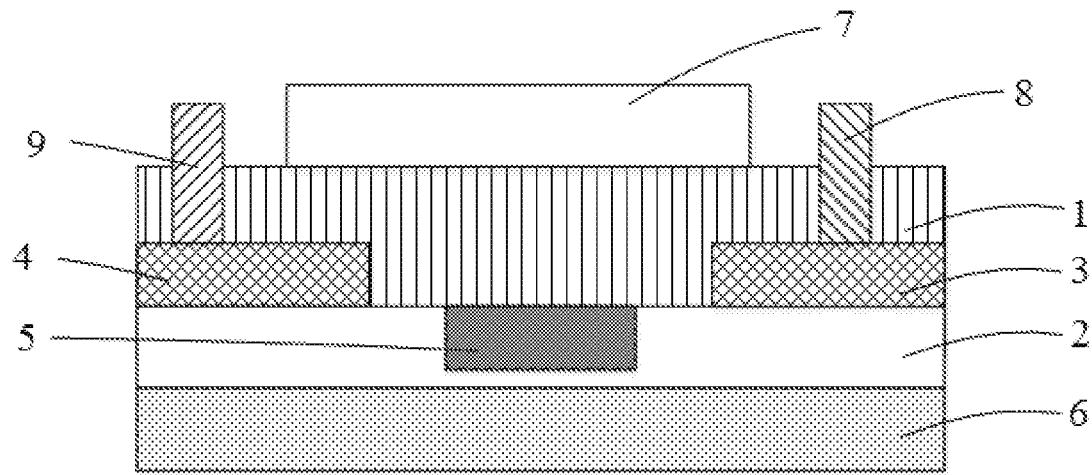
FIG. 2A is a schematic diagram of a transistor according to an embodiment of the present disclosure.

For the top gate structure, specifically, FIG. 2A schematically illustrates a case where the third doping layer 5 is positioned in the channel region. On the substrate 6 there is provided with the active layer 2, on the active layer 2 there is provided with the first doping layer 3, the second doping layer 4 and the gate insulation layer 1, on the first doping layer 3 there is provided with the source electrode 8, on the second doping layer 4 there is provided with the drain electrode 9, on the gate insulation layer 1 there is provided with the gate electrode 7, and between the first doping layer 3 and the second doping layer 4 there is provided with the third doping layer 5. Herein, positions of the source and the drain may be interchangeable. It is to be pointed out that the thickness of the third doping layer 5 is not particularly limited. The third doping layer 5 contacts the active layer 2. That is, a side of the third doping layer 5 reaches a surface of the active layer. It is to be noted that an opposite side of the third doping layer 5 does not necessarily need to reach an opposite surface of the active layer 2. Although FIG. 2A illustrates a case where the opposite side of the third doping layer 5 does not reach the opposite surface of the active layer 2, the embodiments of the present disclosure further include a case where the opposite side of the third doping layer 5 reaches the opposite surface of the active layer 2.

It is also to be pointed out that the third doping layer 5 in FIG. 2A neither contacts the first doping layer 3 nor contacts the second doping layer 4. Nevertheless, the third doping layer 5 may contact the first doping layer 3 or the second doping layer 4 as required, as long as the third doping layer 5 does not contact the first doping layer 3 and the second doping layer 4 simultaneously.

Figure 2B:
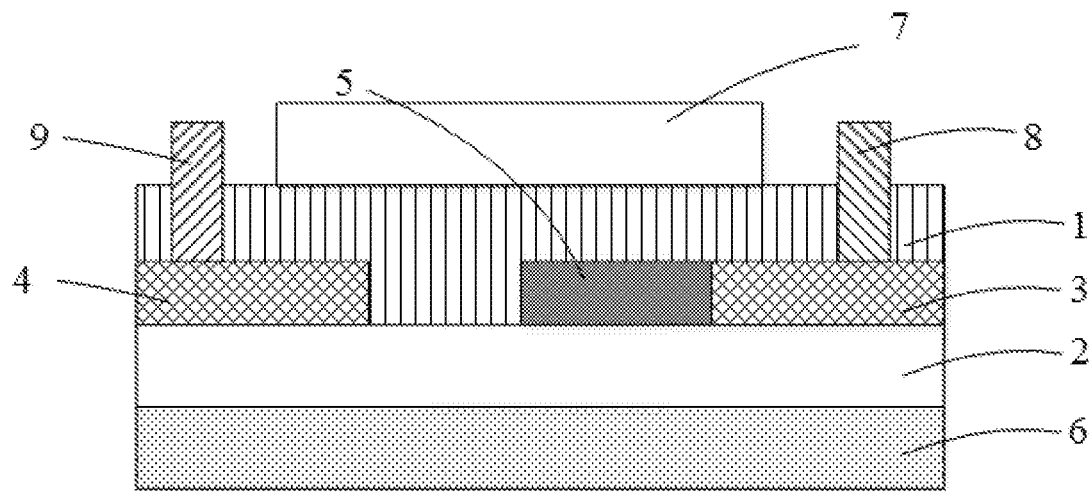
FIG. 2B is a schematic diagram of a transistor according to an embodiment of the present disclosure.

For the top gate structure, specifically, FIG. 2B schematically illustrates a case where the third doping layer 5 is positioned on the channel region. As shown in FIG. 2B, on the substrate 6 there is provided with the active layer 2, on the active layer 2 there is provided with the first doping layer 3, the second doping layer 4 and the gate insulation layer 1, on the gate insulation layer 1 there is provided with the gate electrode 7, on the first doping layer 3 there is provided with the source electrode 8, on the second doping layer 4 there is provided with the drain electrode 9, and between the first doping layer 3 and the second doping layer 4 there is provided with the third doping layer 5. Herein, positions of the source and the drain may be interchangeable. In FIG. 2B, an example is taken in which the third doping layer contacts the first doping layer 3. As shown in FIG. 1B, the third doping layer 5 is positioned on the channel, and a side of the third doping layer 5 contacts the active layer 2. It is to be pointed out that the thickness of the third doping layer 5 is not particularly limited. Although in FIG. 2B the thickness of the third doping layer 5 is equal to that of the second doping layer 4, the thickness of the third doping layer 5 also may be not equal to that of the second doping layer 4.

A doping concentration of the third doping layer 5 may be selected according to actual needs. The present disclosure is not limited thereto. In one embodiment, the third doping layer is heavily doped. For example, an impurity concentration of the third doping layer is more than $10^{18}$ atoms per cubic centimeter. The first doping layer, the second doping layer and the third doping layer have a same conductivity type, such as an N type or P type. The N type may be obtained by doping phosphorus or antimony, whereas the P type may be obtained by doping boron or indium. Further, the first doping layer, the second doping layer, and the third doping layer are N-type amorphous silicon materials.

FIGS. 3A-4B are schematic diagrams of a fabrication procedure according to an embodiment of the present disclosure. The method according to an embodiment of the present disclosure includes forming a gate insulation layer, forming an active layer, the active layer having a source region, a drain region, and a channel region positioned between the source region and the drain region, and forming a first doping layer on the source region and a second doping layer on the drain region. The method further includes forming at least one third doping layer between the first doping layer and the second doping layer, wherein the first doping layer, the second doping layer, and the third doping layer have a same conductivity type. The third doping layer is positioned in the channel region and contacts the gate insulation layer, and the third doping layer does not contact the first doping layer and the second doping layer simultaneously. Alternatively, the third doping layer is positioned on the channel region and only contacts the first doping layer or the second doping layer.

In one embodiment, the gate insulation layer is positioned on a side, opposite to a side where the first doping layer and the second doping layer are formed, of the active layer, and is positioned between the active layer and a substrate. That is, in such a case, a structure of the thin-film transistor is a bottom gate structure.

Figure 3A:
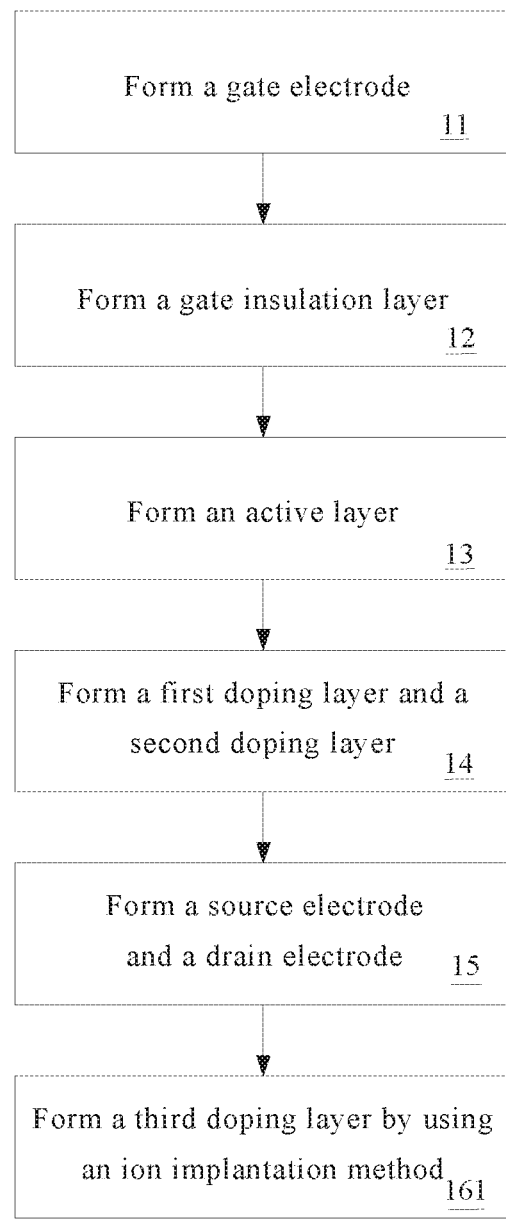
FIG. 3A is a schematic diagram of a fabrication procedure according to an embodiment of the present disclosure.
Figure 3B:
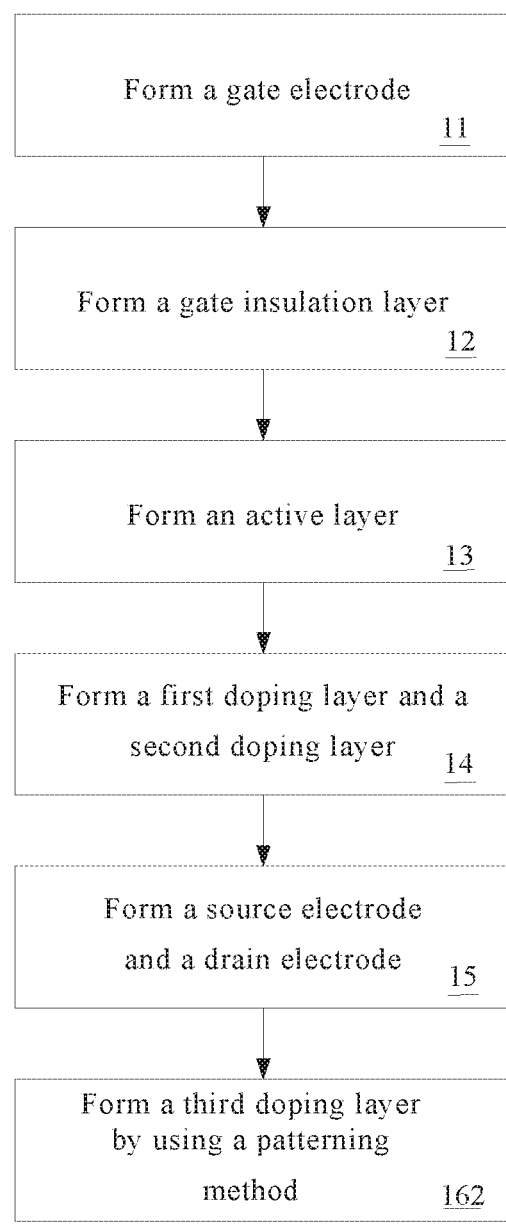
FIG. 3B is a schematic diagram of a fabrication procedure according to an embodiment of the present disclosure.

Specifically, FIGS. 3A-3B schematically illustrate an exemplary method for a bottom gate structure.

As shown in FIG. 3A, in an embodiment, when forming the third doping layer in the channel region, the process of forming a thin-film transistor includes following steps:

S11: forming a gate electrode on a substrate;

S12: forming the gate insulation layer on the gate electrode;

S13: forming an active layer on the gate insulation layer;

S14: forming a first doping layer on the source region of the active layer, and forming a second doping layer on the drain region of the active layer;

S15: forming a source electrode on the first doping layer and forming a drain electrode on the second doping layer; and S161: forming, by using an ion implantation method, in the channel region, the third doping layer in contact with the gate insulation layer.

It is to be noted that herein the Step S161 of forming the third doping layer by using the ion implantation method after the Step S15 of forming the source electrode and the drain electrode is taken as an example. However, the Step S161 of forming the third doping layer by using the ion implantation method does not necessarily follow after the Step S15 of forming the source electrode and the drain electrode, which may be adjusted according to actual needs. In an embodiment, the implanted ions are phosphorus ions or antimony ions.

As shown in FIG. 3B, in an embodiment, when forming the third doping layer in the channel region, the process of forming a thin-film transistor includes following steps:

S11: forming a gate electrode on a substrate;

S12: forming the gate insulation layer on the gate electrode;

S13: forming the active layer on the gate insulation layer;

S14: forming the first doping layer on the source region of the active layer, and forming the second doping layer on the drain region of the active layer;

S15: forming a source electrode on the first doping layer and forming a drain electrode on the second doping layer; and S162: forming a capping layer on an exposed surface of the channel region; and patterning the capping layer to form the third doping layer positioned on the channel region and only in contact with the first doping layer or the second doping layer. In an embodiment, the capping layer is an N-type amorphous silicon material.

In another embodiment, the gate insulation layer is positioned on a side of the active layer where the first doping layer and the second doping layer are formed, and the active layer is positioned between the gate insulation layer and the substrate. That is, in such a case, the structure of the thin-film transistor is a top gate structure.

Figure 4A:
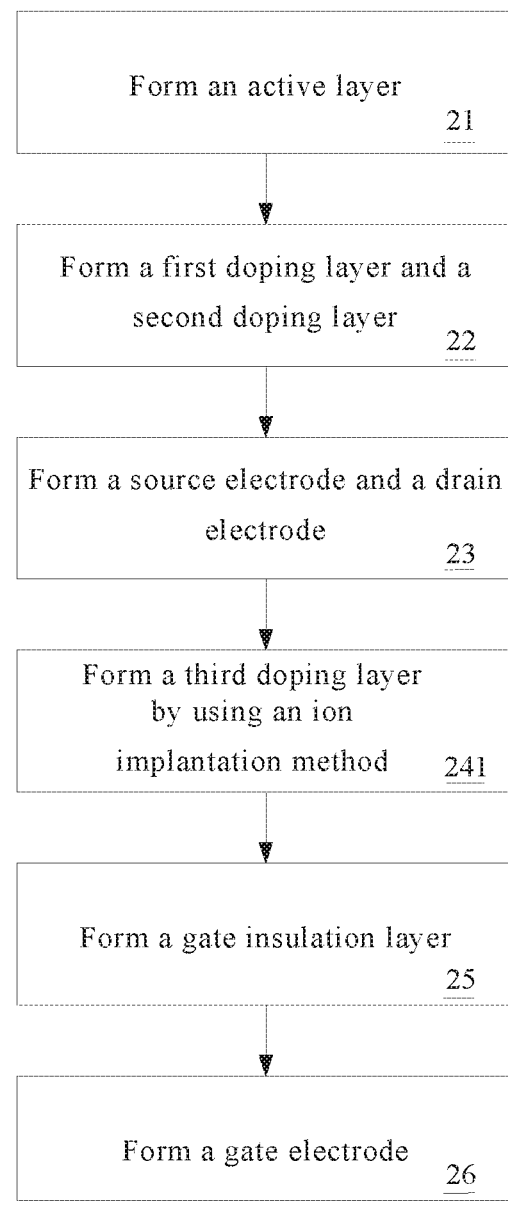
FIG. 4A is a schematic diagram of a fabrication procedure according to an embodiment of the present disclosure.
Figure 4B:
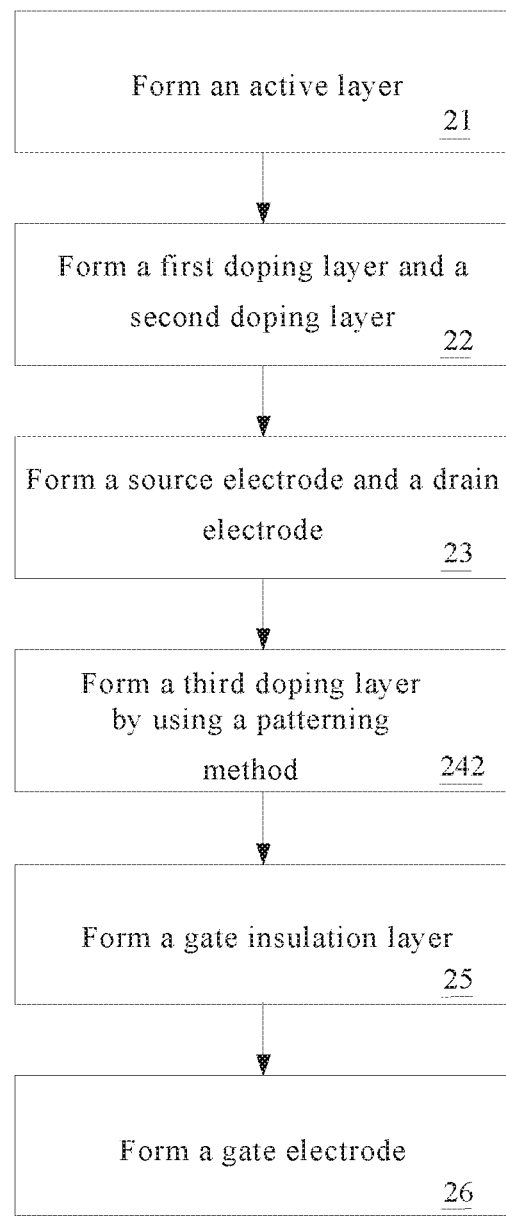
FIG. 4B is a schematic diagram of a fabrication procedure according to an embodiment of the present disclosure.

Specifically, FIGS. 4A-4B schematically illustrate an exemplary method for a top gate structure.

As shown in FIG. 4A, in an embodiment, when forming the third doping layer in the channel region, the process of forming a thin-film transistor includes following steps:

S21: forming an active layer on a substrate;

S22: forming the first doping layer on the source region of the active layer, and forming the second doping layer on the drain region of the active layer;

S23: forming a source electrode on the first doping layer and forming a drain electrode on the second doping layer;

S241: forming, by using an ion implantation method in the channel region, the third doping layer positioned in the channel region and in contact with the gate insulation layer;

S25: forming the gate insulation layer on the channel region of the active layer; and S26: forming a gate electrode on the gate insulation layer.

It is to be noted that herein the Step S241 of forming the third doping layer by using the ion implantation method after the Step S23 of forming the source electrode and the drain electrode is taken as an example. However, the Step S241 of forming the third doping layer by using the ion implantation method does not necessarily follow after the Step S23 of forming the source electrode and the drain electrode, which may be adjusted according to actual needs. In an embodiment, the implanted ions are phosphorus ions or antimony ions.

As shown in FIG. 4B, in an embodiment, when forming the third doping layer on the channel region, the process of forming a thin-film transistor includes following steps:

S21: forming an active layer on a substrate;

S22: forming the first doping layer on the source region of the active layer, and forming the second doping layer on the drain region of the active layer;

S23: forming a source electrode on the first doping layer and forming a drain electrode on the second doping layer;

S242: forming a capping layer on an exposed surface of the channel; and patterning the capping layer to form the third doping layer positioned on the channel region and only in contact with the first doping layer or the second doping layer. In an embodiment, the capping layer is an N-type amorphous silicon material.

S25: forming the gate insulation layer on the channel region of the active layer; and S26: forming a gate electrode on the gate insulation layer.

In the method according to the embodiments of the present disclosure, the first doping layer, the second doping layer, and the third doping layer have a same conductivity type, such as an N type (or P type). In addition, a doping concentration of the third doping layer 5 may be selected according to actual needs. The present disclosure is not limited thereto. In one embodiment, the third doping layer is heavily doped. For example, an impurity concentration of the third doping layer is more than $10^{18}$ atoms per cubic centimeter. Materials of the active layer may include amorphous silicon and may also include any other suitable materials.

The flowcharts as depicted in the present disclosure are merely exemplary. There may be many variations to the flowcharts or steps described therein without departing from the spirit of the present disclosure. For instance, the steps may be performed in a differing order or steps may be added, deleted, or modified. All of these variations are considered as a part of an aspect requested to be protected.

An embodiment of the present disclosure provides an array substrate, which includes the thin-film transistor according to the forgoing embodiment. Specifically, the array substrate includes a substrate, on which a data line, a gate line, a pixel electrode, and the forgoing thin-film transistor are arranged. Another embodiment of the present disclosure provides a display panel, which includes the array substrate according to the forgoing embodiment. Still another embodiment of the present disclosure provides a display device, which includes the display panel according to the forgoing embodiment.

Figure 5:
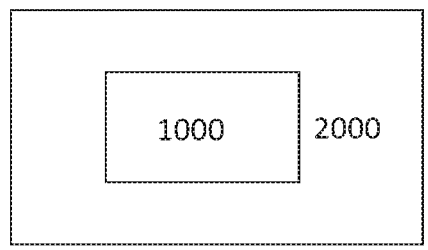
FIG. 5 is a schematic diagram showing an example embodiment of an array substrate.

FIG. 5 is a schematic diagram showing an example embodiment of an array substrate. As shown FIG. 5, an array substrate 2000 includes a thin-film transistor 1000. In this example embodiment, the thin-film transistor 1000 is as shown in FIGS. 1A, 1B, 2A, and 2B.

Figure 6:
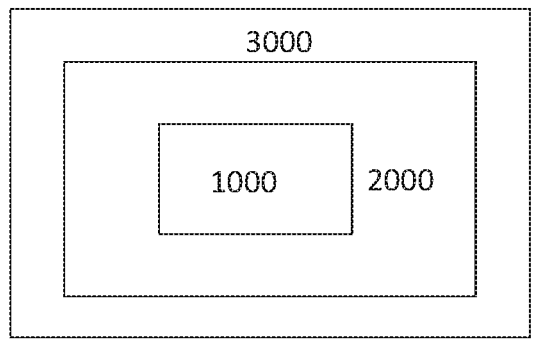
FIG. 6 is a schematic diagram showing an example embodiment of a display panel.

FIG. 6 is a schematic diagram showing an example embodiment of a display panel. In this example embodiment, the display panel 3000 includes a substrate 2000 which is shown in FIG. 5.

Figure 7:
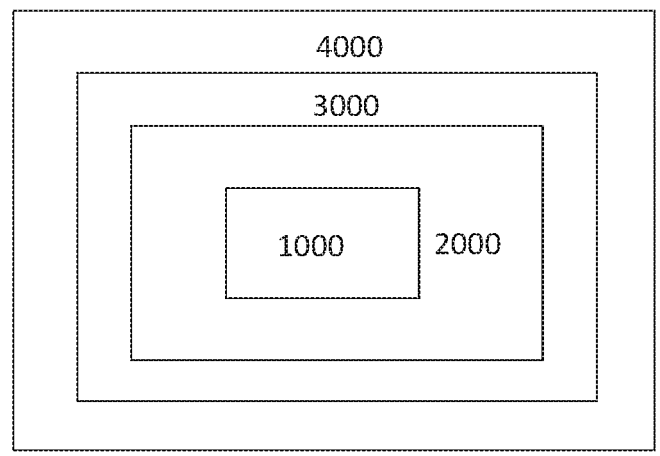
FIG. 7 is a schematic diagram showing an example embodiment of a display device.

FIG. 7 is a schematic diagram showing an example embodiment of a display device. In this example embodiment, the display device 4000 includes a display panel 3000 which is shown in FIG. 6.

An embodiment of the present disclosure provides a method for fabricating an array substrate, which includes the method for fabricating a thin-film transistor according to the forgoing embodiment. Another embodiment of the present disclosure provides a method for fabricating a display panel, which includes the method for fabricating an array substrate according to the forgoing embodiment. Still another embodiment of the present disclosure provides a method for fabricating a display device, which includes the method for fabricating a display panel according to the forgoing embodiment.

The embodiments of the present disclosure provide a solution for significantly shortening the channel length. The third doping layer is arranged between the first doping layer and the second doping layer on the source region and the drain region of the active layer, and the three doping layers have the same conductivity type. The third doping layer may be positioned in the channel region and contacts the gate insulation layer, and the third doping layer does not contact the first doping layer and the second doping layer simultaneously. The third doping layer also may be positioned on the channel region and only contacts the first doping layer or the second doping layer. Using the solution provided by the embodiments of the present disclosure, the channel length can be reduced, therefore, a negative effect on the pixel aperture ratio can be avoided and power consumption can be reduced.

The display device in the embodiments of the present disclosure may be any product or component having a display function, such as a mobile phone, a tablet computer, a TV set, a notebook computer, a digital photo frame, a navigation device and so on.

Certain specific embodiments have been described, and these embodiments are exhibited merely by examples and are not intended to limit the scope of the present disclosure. Indeed, the novel embodiments set forth herein may be implemented in a variety of other forms, in addition, various omissions, substitutions, and changes can be made in the form of the embodiments set forth herein without departing from the spirit of the present disclosure. The appended claims and equivalents thereof are intended to cover this form or modification thereof that fall within the scope and spirit of the present disclosure.

What is claimed is:

1. A thin-film transistor comprising a gate insulation layer, an active layer having i) a source region, ii) a drain region, and iii) a channel region positioned between the source region and the drain region, a first doping layer on the source region, and a second doping layer on the drain region, wherein the thin-film transistor further comprises:

at least one third doping layer arranged between the first doping layer and the second doping layer, wherein the first doping layer, the second doping layer, and the third doping layer have a same conductivity type, wherein:
the channel region includes a first side and a second side opposite to the first side, wherein the first side is nearer to the gate insulation layer compared with the second side, wherein the third doping layer is positioned on the first side or on the second side and overlaps with a top surface of the channel region, and wherein the third doping layer only contacts one of the first doping layer and the second doping layer.

2. The thin-film transistor according to claim 1, further comprising a source electrode arranged on the first doping layer, and a drain electrode arranged on the second doping layer, wherein the gate insulation layer is positioned on a side, opposite to a side where the first doping layer and the second doping layer are formed, of the active layer, and is positioned between the active layer and a substrate.

3. The thin-film transistor according to claim 1, further comprising a source electrode arranged on the first doping layer, and a drain electrode arranged on the second doping layer, wherein the gate insulation layer is positioned on a side where the first doping layer and the second doping layer are formed, of the active layer, and the active layer is positioned between the gate insulation layer and a substrate.

4. The thin-film transistor according to claim 1, wherein the active layer comprises amorphous silicon.

5. The thin-film transistor according to claim 1, wherein the conductivity type of the first doping layer, the second doping layer, and the third doping layer is an N type.

6. An array substrate comprising the thin-film transistor according to claim 1.

7. A display panel comprising the array substrate according to claim 6.

8. A display device comprising the display panel according to claim 7.

9. A method for fabricating a thin-film transistor, comprising forming an active layer, the active layer having a source region, a drain region, and a channel region positioned between the source region and the drain region, and forming a first doping layer on the source region and a second doping layer on the drain region, wherein the method further comprises:

forming at least one third doping layer between the first doping layer and the second doping layer, wherein the first doping layer, the second doping layer, and the third doping layer have a same conductivity type, wherein:
the channel region includes a first side and a second side opposite to the first side, wherein the first side is nearer to the gate insulation layer compared with the second side, wherein the third doping layer is positioned on the first side or on the second side and overlaps with a top surface of the channel region, wherein the third doping layer is only in contact with one of the first doping layer and the second doping layer.

10. The method according to claim 9, further comprising forming a gate electrode on a substrate, and forming the gate insulation layer on the gate electrode, wherein:
forming an active layer comprises forming the active layer on the gate insulation layer after the gate insulation layer is formed; and
the third doping layer comprises forming, by using an ion implantation method, in the channel region, the third doping layer in contact with the gate insulation layer.

11. The method according to claim 9, further comprising forming a gate electrode on a substrate, forming the gate insulation layer on the gate electrode, and forming a source electrode on the first doping layer and a drain electrode on the second doping layer, wherein:
forming an active layer comprises forming the active layer on the gate insulation layer after the gate insulation layer is formed; and
forming the third doping layer comprises forming a capping layer on an exposed surface of the channel region after the source electrode and the drain electrode are formed, and patterning the capping layer to form the third doping layer positioned on the channel region and only in contact with one of the first doping layer and the second doping layer.

12. The method according to claim 9, further comprising forming the gate insulation layer on the channel region after the active layer is formed on a substrate and the first doping layer and the second doping layer are formed, wherein forming the third doping layer comprises forming, by using an ion implantation method, the third doping layer in contact with the gate insulation layer.

13. The method according to claim 9, further comprising forming a source electrode on the first doping layer and forming a drain electrode on the second doping layer, and forming the gate insulation layer on the channel region after the active layer is formed on a substrate and the first doping layer and the second doping layer are formed, wherein forming the third doping layer comprises i) forming a capping layer on an exposed surface of the channel after the source electrode and the drain electrode are formed and before the gate insulation layer is formed, and ii) patterning the capping layer to form the third doping layer positioned on the channel region and only in contact with one of the first doping layer and the second doping layer.

14. The method according to claim 9, wherein the active layer comprises amorphous silicon.

15. The method according to claim 9, wherein the conductivity type of the first doping layer, the second doping layer, and the third doping layer is an N type.

16. A method for fabricating an array substrate, comprising the method for fabricating a thin-film transistor according to claim 9.

17. A method for fabricating a display panel comprising the method for fabricating an array substrate according to claim 16.

18. A method for fabricating a display device comprising the method for fabricating a display panel according to claim 17.

19. An array substrate comprising the thin-film transistor according to claim 2.

20. An array substrate comprising the thin-film transistor according to claim 3.

* * * * *